(12) United States Patent
Lee

(10) Patent No.: US 8,501,521 B1
(45) Date of Patent: *Aug. 6, 2013

(54) COPPER SPECIES SURFACE TREATMENT OF THIN FILM PHOTOVOLTAIC CELL AND MANUFACTURING METHOD

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 639 days.

This patent is subject to a terminal disclaimer.

(21) Appl. No.: 12/564,044

(22) Filed: Sep. 21, 2009

Related U.S. Application Data

(60) Provisional application No. 61/101,130, filed on Sep. 29, 2008, provisional application No. 61/101,113, filed on Sep. 29, 2008.

(51) Int. Cl.
*H01L 21/38* (2006.01)

(52) U.S. Cl.
USPC .............. 438/85; 257/E21.466; 257/E21.467; 257/E21.483; 257/E21.485; 257/E21.497

(58) Field of Classification Search
USPC ................... 438/85; 257/E21.466, 467, 483, 257/485, 497
See application file for complete search history.

(56) References Cited

U.S. PATENT DOCUMENTS

| | | | |
|---|---|---|---|
| 3,520,732 A | 7/1970 | Nakayama et al. | |
| 3,975,211 A | 8/1976 | Shirland | |
| 4,062,038 A | 12/1977 | Cuomo et al. | |
| 4,332,974 A | 6/1982 | Fraas | |
| 4,335,266 A | 6/1982 | Mickelsen et al. | |
| 4,441,113 A | 4/1984 | Madan | |
| 4,442,310 A | 4/1984 | Carlson et al. | |
| 4,461,922 A | 7/1984 | Gay et al. | |
| 4,465,575 A | 8/1984 | Love et al. | |
| 4,471,155 A | 9/1984 | Mohr et al. | |

(Continued)

FOREIGN PATENT DOCUMENTS

| AU | 1998/7865198 | 2/1999 |
|---|---|---|
| AU | 2001/40599 A1 | 8/2001 |

(Continued)

OTHER PUBLICATIONS

Klenk (Thin Solid Films 387, pp. 135-140, (2001)).*

(Continued)

*Primary Examiner* — Minchul Yang
(74) *Attorney, Agent, or Firm* — Kilpatrick Townsend & Stockton LLP

(57) ABSTRACT

A method for forming a thin film photovoltaic device. The method includes providing a transparent substrate comprising a surface region. A first electrode layer is formed overlying the surface region. A copper layer is formed overlying the first electrode layer and an indium layer is formed overlying the copper layer to form a multi-layered structure. The method subjects at least the multi-layered structure to a thermal treatment process in an environment containing a sulfur bearing species to form a copper indium disulfide material and a thickness of substantially copper sulfide material. The thickness of the copper sulfide material is removed to expose a surface region having a copper poor surface comprising a copper to indium atomic ratio of less than about 0.95:1. The method subjects the copper poor surface to a copper species to convert the copper poor surface from an n-type semiconductor characteristic to a p-type semiconductor characteristic. A window layer is formed overlying the copper indium disulfide material.

16 Claims, 9 Drawing Sheets

U.S. PATENT DOCUMENTS

| | | | |
|---|---|---|---|
| 4,499,658 A | 2/1985 | Lewis |
| 4,507,181 A | 3/1985 | Nath et al. |
| 4,517,403 A | 5/1985 | Morel et al. |
| 4,518,855 A | 5/1985 | Malak |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,798,660 A | 1/1989 | Ermer et al. |
| 4,816,082 A | 3/1989 | Guha et al. |
| 4,816,420 A | 3/1989 | Bozler et al. |
| 4,837,182 A | 6/1989 | Bozler et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmom et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,397,401 A | 3/1995 | Toma et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | Van den Berg |
| 5,528,397 A | 6/1996 | Zavracy et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,726,065 A | 3/1998 | Szlufcik et al. |
| 5,738,731 A | 4/1998 | Shindo et al. |
| 5,868,869 A | 2/1999 | Albright et al. |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,166,319 A | 12/2000 | Matsuyama |
| 6,172,297 B1 | 1/2001 | Hezel et al. |
| 6,258,620 B1 | 7/2001 | Morel et al. |
| 6,294,274 B1 | 9/2001 | Kawazoe et al. |
| 6,307,148 B1 | 10/2001 | Takeuchi et al. |
| 6,328,871 B1 | 12/2001 | Ding et al. |
| RE37,512 E | 1/2002 | Szlufcik et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,441,413 B2 | 10/2008 | Bae et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,026,122 B1 | 9/2011 | Lee |
| 8,193,028 B2 | 6/2012 | Lee |
| 8,198,122 B2 | 6/2012 | Lee |
| 8,211,736 B2 | 7/2012 | Lee |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0187917 A1 | 9/2004 | Pichler |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0130890 A1 | 6/2006 | Hantschel et al. |
| 2006/0160261 A1 | 7/2006 | Sheats et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |

| | | | |
|---|---|---|---|
| 2007/0089782 A1 | 4/2007 | Scheuten et al. | |
| 2007/0116892 A1 | 5/2007 | Zwaap | |
| 2007/0116893 A1 | 5/2007 | Zwaap | |
| 2007/0151596 A1 | 7/2007 | Nasuno et al. | |
| 2007/0163643 A1 | 7/2007 | Van Duren et al. | |
| 2007/0169810 A1 | 7/2007 | Van Duren et al. | |
| 2007/0193623 A1 | 8/2007 | Krasnov | |
| 2007/0209700 A1 | 9/2007 | Yonezawa et al. | |
| 2007/0264488 A1 | 11/2007 | Lee | |
| 2007/0283998 A1 | 12/2007 | Kuriyagawa et al. | |
| 2007/0289624 A1 | 12/2007 | Kuriyagawa et al. | |
| 2008/0032044 A1 | 2/2008 | Kuriyagawa et al. | |
| 2008/0041446 A1 | 2/2008 | Wu et al. | |
| 2008/0057616 A1 | 3/2008 | Robinson et al. | |
| 2008/0092945 A1 | 4/2008 | Munteanu et al. | |
| 2008/0092953 A1 | 4/2008 | Lee | |
| 2008/0092954 A1 | 4/2008 | Choi | |
| 2008/0105294 A1 | 5/2008 | Kushiya et al. | |
| 2008/0110491 A1 | 5/2008 | Buller et al. | |
| 2008/0110495 A1 | 5/2008 | Onodera et al. | |
| 2008/0121264 A1 | 5/2008 | Chen et al. | |
| 2008/0121277 A1 | 5/2008 | Robinson et al. | |
| 2008/0210303 A1 | 9/2008 | Lu et al. | |
| 2008/0280030 A1 | 11/2008 | Van Duren et al. | |
| 2009/0021157 A1 | 1/2009 | Kim et al. | |
| 2009/0087940 A1 | 4/2009 | Kushiya | |
| 2009/0087942 A1 | 4/2009 | Meyers | |
| 2009/0145477 A1* | 6/2009 | Moon et al. | 136/256 |
| 2009/0145746 A1 | 6/2009 | Hollars | |
| 2009/0217969 A1 | 9/2009 | Matsushima et al. | |
| 2009/0234987 A1 | 9/2009 | Lee et al. | |
| 2009/0235983 A1 | 9/2009 | Girt et al. | |
| 2009/0235987 A1 | 9/2009 | Akhtar et al. | |
| 2009/0293945 A1 | 12/2009 | Peter | |
| 2010/0081230 A1 | 4/2010 | Lee | |
| 2010/0087016 A1 | 4/2010 | Britt et al. | |
| 2010/0087026 A1 | 4/2010 | Winkeler et al. | |
| 2010/0096007 A1 | 4/2010 | Mattmann et al. | |
| 2010/0101648 A1 | 4/2010 | Morooka et al. | |
| 2010/0101649 A1 | 4/2010 | Huignard et al. | |
| 2010/0122726 A1 | 5/2010 | Lee | |
| 2010/0197051 A1 | 8/2010 | Schlezinger et al. | |
| 2010/0210064 A1 | 8/2010 | Hakuma et al. | |
| 2010/0267190 A1 | 10/2010 | Hakuma et al. | |
| 2011/0070682 A1 | 3/2011 | Wieting | |
| 2011/0070683 A1 | 3/2011 | Wieting | |
| 2011/0070684 A1 | 3/2011 | Wieting | |
| 2011/0070685 A1 | 3/2011 | Wieting | |
| 2011/0070686 A1 | 3/2011 | Wieting | |
| 2011/0070687 A1 | 3/2011 | Wieting | |
| 2011/0070688 A1 | 3/2011 | Wieting | |
| 2011/0070689 A1 | 3/2011 | Wieting | |
| 2011/0070690 A1 | 3/2011 | Wieting | |
| 2011/0073181 A1 | 3/2011 | Wieting | |
| 2011/0080690 A1 | 4/2011 | Ning et al. | |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | WO 01/57932 A1 | 8/2001 |
| WO | WO 2005/011002 | 2/2005 |
| WO | WO 2006/126598 A1 | 11/2006 |
| WO | WO 2007/022221 A2 | 2/2007 |
| WO | WO 2007/077171 A2 | 7/2007 |
| WO | WO 2008/025326 A2 | 3/2008 |

OTHER PUBLICATIONS

Bandyopadhyaya (Solar Energy Materials and Solar Cells, 60, pp. 323-339, (2000)).*

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Baumann, A., et al., Photovoltaic Technology Review, presentation Dec. 6, 2004, 18 pages.

Chopra et al., "Thin-Film Solar Cells: An Overview", 2004, Progress in Photovoltaics: Research and Applications, 2004, vol. 12, pp. 69-92.

Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir, 1998, vol. 14, No. 15, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Processing of $CuIn_{1-x}GaxSe_2$ Solar Cells on Rigid and Flexible Substrates using Nanoparticle Precursor Inks", Thin Solid Films, 2003, vol. 431-432, pp. 53-57.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Printing Process for CIGS Solar Cells on Rigid and Flexible Substrates", 29th IEEE Photovoltaic Specialists Conference, New Orleans, LA, IEEE, 2002, pp. 688-691.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Metha et al., "A graded diameter and oriented nanorod-thin film structure for solar cell application: a device proposal", Solar Energy Materials & Solar Cells, 2005, vol. 85, pp. 107-113.

Srikant V., et al., "On the Optical Band Gap of Zinc Oxide", Journal of Applied Physics, vol. 83, No. 10, May 15, 1998, pp. 5447-5451.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals, 1997, vol. 91, pp. 347-349.

Examination Report for PCT Patent Application No. PCT/US2008/0077965, Apr. 8, 2010, 7 pages.

International Search Report and Written Opinion for PCT Patent Application No. PCT/US2009/058829 mailed on Mar. 11, 2011, 12 pages.

International Search Report and Written Opinion for PCT Patent Application No. PCT/US2009/065351, mailed on Jan. 26, 2010, 13 pages.

International Search Report and Written Opinion for PCT Patent Application No. PCT/US09/59097, mailed on Dec. 23, 2009, 12 pages.

International Search Report and Written Opinion for PCT Patent Application No. PCT/US09/59095, mailed on Dec. 4, 2009, 12 pages.
International Search Report and Written Opinion for PCT Patent Application No. PCT/US08/77965, mailed on Dec. 9, 2008, 8 pages.
International Search Report and Written Opinion for PCT Patent Application No. PCT/US08/78019 mailed on Dec. 8, 2008, 9 pages.
Non-Final Office Action of Sep. 15, 2011 for U.S. Appl. No. 12/237,377, 18 pages.
Non-Final Office Action of Sep. 7, 2011 for U.S. Appl. No. 12/237,369, 21 pages.
Notice of Allowance of Sep. 2, 2011 for U.S. Appl. No. 12/953,721, 20 pages.
Notice of Allowance of Aug. 26, 2011 for U.S. Appl. No. 12/953,725, 20 pages.
Notice of Allowance of Aug. 25, 2011 for U.S. Appl. No. 12/953,729, 19 pages.
Non-Final Office Action of Aug. 4, 2011 for U.S. Appl. No. 12/479,409, 39 pages.
Notice of Allowance of Aug. 2, 2011 for U.S. Appl. No. 12/953,716, 18 pages.
Notice of Allowance of Aug. 1, 2011 for U.S. Appl. No. 12/577,132, 34 pages.
Notice of Allowance of Aug. 1, 2011 for U.S. Appl. No. 12/953,701,18 pages.
Notice of Allowance of Aug. 1, 2011 for U.S. Appl. No. 12/953,708, 17 pages.
Final Office Action of May 31, 2011 for U.S. Appl. No. 12/621,489, 13 pages.
Notice of Allowance of May 25, 2011 for U.S. Appl. No. 12/566,651, 8 pages.
Non-Final Office Action of May 2, 2011 for U.S. Appl. No. 12/953,729, 9 pages.
Non-Final Office Action of May 2, 2011 for U.S. Appl. No. 12/953,725, 9 pages.
Non-Final Office Action of May 2, 2011 for U.S. Appl. No. 12/953,721, 9 pages.
Non-Final Office Action of May 2, 2011 for U.S. Appl. No. 12/953,716, 9 pages.
Non-Final Office Action of May 2, 2011 for U.S. Appl. No. 12/953,708, 9 pages.
Non-Final Office Action of May 2, 2011 for U.S. Appl. No. 12/953,701, 9 pages.
Non-Final Office Action of Apr. 28, 2011 for U.S. Appl. No. 12/237,369, 17 pages.
Notice of Allowance of Apr. 27, 2011 for U.S. Appl. No. 12/564,886, 11 pages.
Notice of Allowance of Apr. 26, 2011 for U.S. Appl. No. 12/564,046, 11 pages.
Notice of Allowance of Apr. 25, 2011 for U.S. Appl. No. 12/563,065, 11 pages.
Notice of Allowance of Apr. 19, 2011 for U.S. Appl. No. 12/567,715, 11 pages.
Notice of Allowance of Apr. 8, 2011 for U.S. Appl. No. 12/953,697, 11 pages.
Notice of Allowance of Apr. 5, 2011 for U.S. Appl. No. 12/953,679, 11 pages.
Notice of Allowance of Apr. 5, 2011 for U.S. Appl. No. 12/953,674, 11 pages.
Final Office Action of Dec. 27, 2010 for U.S. Appl. No. 12/479,409, 26 pages.
Non-Final Office Action of Dec. 17, 2010 for U.S. Appl. No. 12/577,132, 11 pages.
Notice of Allowance of Dec. 14, 2010 for U.S. Appl. No. 12/558,117, 8 pages.
Supplemental Notice of Allowability of Dec. 10, 2010 for U.S. Appl. No. 12/568,641, 3 pages.
Notice of Allowance of Nov. 19, 2010 for U.S. Appl. No. 12/568,641, 6 pages.
Notice of Allowance of Oct. 21, 2010 for U.S. Appl. No. 12/565,735, 4 pages.
Restriction Requirement of Oct. 18, 2010 for U.S. Appl. No. 12/568,641, 4 pages.
Non-Final Office Action of Sep. 28, 2010 for U.S. Appl. No. 12/237,371, 15 pages.
Non-Final Office Action of Sep. 22, 2010 for U.S. Appl. No. 12/621,489, 23 pages.
Notice of Allowance of Aug. 27, 2010 for U.S. Appl. No. 12/509,136, 8 pages.
Non-Final Office Action of Aug. 18, 2010 for U.S. Appl. No. 12/237,369, 17 pages.
Non-Final Office Action of Aug. 5, 2010 for U.S. Appl. No. 12/565,735, 14 pages.
Non-Final Office Action of Jul. 22, 2010 for U.S. Appl. No. 12/479,409, 21 pages.
Non-Final Office Action of May 27, 2010 for U.S. Appl. No. 12/568,641, 10 pages.
Rudmann, "Efficiency enhancement of Cu(In,Ga)Se2 solar cells due to post-deposition Na incorporation," Appl. Phys. Lett. 84, pp. 1129-1131, 2004.
Vasekar, "Effect of sodium addition on Cu-deficient CUIn1-xGaxS2 thin film solar cells," Solar energy materials, 93, pp. 6. 9-73, 2009.

* cited by examiner

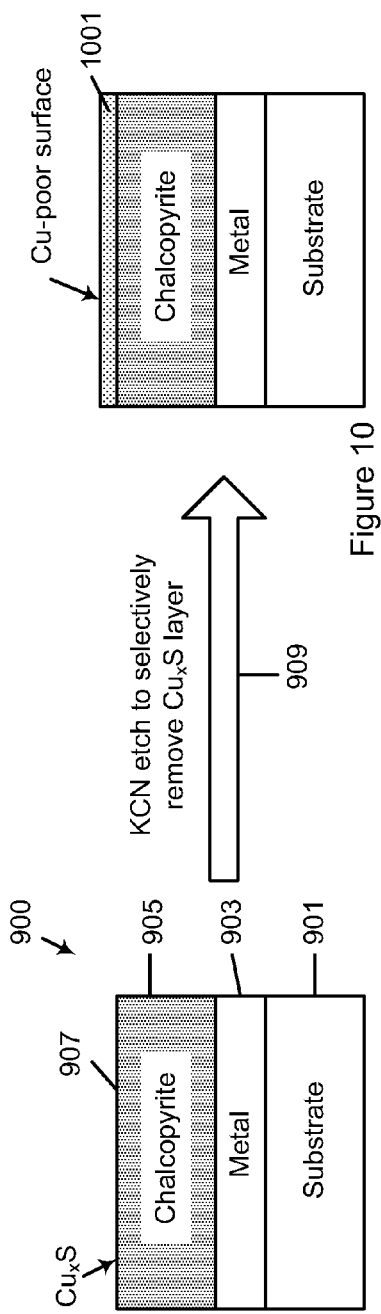
Figure 9
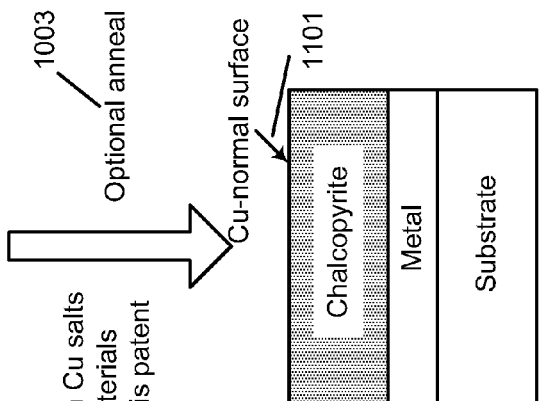
Figure 10
Figure 11

COPPER SPECIES SURFACE TREATMENT OF THIN FILM PHOTOVOLTAIC CELL AND MANUFACTURING METHOD

CROSS-REFERENCES TO RELATED APPLICATIONS

This application claims priority to U.S. Provisional Patent Application No. 61/101,130, filed Sep. 29, 2008, entitled "COPPER SPECIES SURFACE TREATMENT OF THIN FILM PHOTOVOLTAIC CELL AND MANUFACTURING METHOD" by inventor HOWARD W. H. LEE, commonly assigned and incorporated by reference herein for all purposes. This application is related to U.S. Provisional Patent Application No. 61/101,113 filed Sep. 29, 2009, commonly assigned and incorporated by reference herein for all purposes. This application is also related to U.S. patent application Ser. No. 12/560,046 filed Sep. 21, 2009, commonly assigned and incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to photovoltaic materials and manufacturing method. More particularly, the present invention provides a method and structure for manufacture of high efficiency thin film photovoltaic cells. Merely by way of example, the present method and materials include absorber materials made of copper indium disulfide species, copper tin sulfide, iron disulfide, or others for single junction cells or multi junction cells.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, a method and a structure for forming thin film semiconductor materials for photovoltaic applications are provided. More particularly, the present invention provides a method and structure for forming semiconductor materials used for the manufacture of high efficiency photovoltaic cells. Merely by way of example, the present method and materials include absorber materials made of copper indium disulfide species, copper tin sulfide, iron disulfide, or others for single junction cells or multi junction cells.

In a specific embodiment, a method for forming a thin film photovoltaic device is provided. The method includes providing a transparent substrate comprising a surface region. A first electrode layer is formed overlying the surface region. The method includes forming a copper layer overlying the first electrode layer and forming an indium layer overlying the copper layer to form a multi-layered structure. In a specific embodiment, the method includes subjecting at least the multi-layered structure to a thermal treatment process in an environment containing a sulfur bearing species. The method forms a copper indium disulfide material from at least the thermal treatment process of the multi-layered structure. In a specific embodiment, the copper indium disulfide material comprising a copper-to-indium atomic ratio ranging from about 1.2:1 to about 2:1 and a thickness of a substantially copper sulfide material having a copper sulfide surface region. The method includes removing the thickness of the copper sulfide material to expose a surface region having a copper poor surface. The copper poor surface comprises a copper to indium atomic ratio of less than about 0.95:1. The method subjects the copper poor surface to a copper species to convert the copper poor surface from an n-type semiconductor characteristic to a p-type semiconductor characteristic. The method further subjects the copper poor surface to a treatment process (e.g., thermal treatment) during a time period associated with the subjecting of the copper poor surface with the copper species. A window layer is formed overlying the copper indium disulfide material.

In an alternative embodiment, a method for forming a thin film photovoltaic device is provided. The method includes providing a transparent substrate comprising a surface region. A first electrode layer is formed overlying the surface region. In a specific embodiment, the method forms a copper indium material comprising an atomic ratio of Cu:In ranging from about 1.35:1 to about 1.60:1 by at least sputtering a target comprising an indium copper material. The method subjects the copper indium material to a first thermal treatment process in an environment containing a sulfur bearing species to form a copper indium disulfide material from at least the first thermal treatment process of the copper indium material in a specific embodiment. In a specific embodiment, a copper poor copper indium disulfide material is formed within a portion of the copper indium disulfide material. The copper poor copper indium disulfide material has an atomic ration of Cu:In of about 0.99 and less. In a specific embodiment, the method includes compensating the copper poor copper indium disulfide material using a copper species to change in characteristic from an n-type to a p-type. The method further forms a window layer overlying the copper indium disulfide material.

In a yet alternative embodiment, a method for forming a thin film photovoltaic device is provided. The method includes providing a transparent substrate comprising a surface region. A first electrode layer is formed overlying the surface region. The method includes forming a chalcopyrite material overlying the electrode layer. In a specific embodiment, the chalcopyrite material comprises at least a copper poor copper indium disulfide material. The copper poor copper indium disulfide material includes a copper poor copper indium disulfide material surface. The copper poor copper indium disulfide surface has an atomic ratio of Cu:In of about 0.99 and less in a specific embodiment. The method includes compensating the copper poor copper indium disulfide material using a copper species to change in the copper poor copper indium disulfide material from an n-type semiconductor characteristic a p-type semiconductor characteristic in a specific embodiment. The method forms a window layer overlying the chalcopyrite material and forms a second electrode layer overlying the window layer.

In a still yet alternative embodiment, a thin film photovoltaic device is provided. The thin film photovoltaic device includes a substrate. The substrate includes a surface region. A first electrode layer overlies the surface region. A chalcopyrite material overlies the first electrode layer. In a specific embodiment, the thin film photovoltaic device includes a copper poor copper indium disulfide surface having an atomic ratio of Cu:In of about 0.99 and less. The thin film photovoltaic device includes a compensating copper species provided within one or more portions of the copper poor copper indium disulfide surface to change the copper poor copper indium disulfide surface from an n-type semiconductor characteristic to a p-type semiconductor characteristic in a specific embodiment. The semiconductor includes a window layer overlying the copper indium disulfide material and a second electrode layer overlying the window layer.

Many benefits are achieved by ways of present invention. For example, the present invention uses starting materials that are commercially available to form a thin film of semiconductor bearing material overlying a suitable substrate member. The thin film of semiconductor bearing material can be further processed to form a semiconductor thin film material of desired characteristics, such as atomic stoichiometry, impurity concentration, carrier concentration, doping, and others. In a specific embodiment, the band gap of the resulting copper indium disulfide material is about 1.55 eV. Additionally, the present method uses environmentally friendly materials that are relatively less toxic than other thin-film photovoltaic materials. In a preferred embodiment, the present method and resulting structure is substantially free from a parasitic junction on an absorber layer based upon a copper poor chalcopyrite material. In a specific embodiment, the copper ion includes Cu+, Cu2+, and any combinations, and others. Also in a preferred embodiment, the open circuit voltage of the chalcopyrite material such as copper indium disulfide ranges from about 0.8 volts and greater and preferably 0.9 volts and greater or 1.0 volts and greater up to 1.2 volts. Depending on the embodiment, one or more of the benefits can be achieved. These and other benefits will be described in more detailed throughout the present specification and particularly below.

Merely by way of example, the present method and materials include absorber materials made of copper indium disulfide species, copper tin sulfide, iron disulfide, or others for single junction cells or multi junction cells.

BRIEF DESCRIPTION OF THE DRAWINGS

FIGS. 9-11 are simplified diagrams illustrating a method and structure for forming a thin film photovoltaic device including a copper species treatment according to an embodiment of the present invention.

DETAILED DESCRIPTION OF THE INVENTION

According to embodiments of the present invention, a method and a structure for forming semiconductor materials for photovoltaic applications are provided. More particularly, the present invention provides a method for manufacturing thin film photovoltaic devices. Merely by way of example, the method has been used to provide a copper indium disulfide thin film material for high efficiency solar cell application. But it would be recognized that the present invention has a much broader range of applicability, for example, embodiments of the present invention may be used to form other semiconducting thin films or multilayers comprising iron sulfide, cadmium sulfide, zinc selenide, and others, and metal oxides such as zinc oxide, iron oxide, copper oxide, and others.

Figure 1:
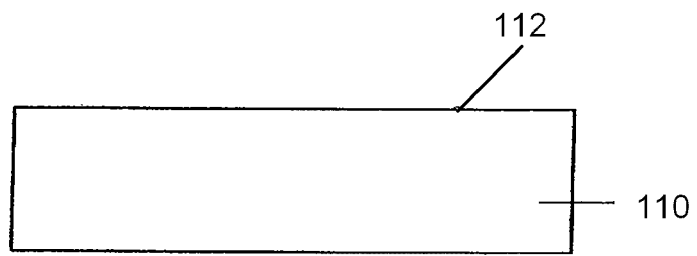
FIGS. 1-8 are schematic diagrams illustrating a method and structure for forming a thin film photovoltaic device according to an embodiment of the present invention.

FIGS. 1-8 are simplified schematic diagrams illustrating a method for forming a thin film photovoltaic device according to an embodiment of the present invention. These diagrams are merely examples, which should not unduly limit the claims herein. One skilled in the art would recognize other variations, modifications, and alternatives. As shown in FIG. 1, a substrate 110 is provided. In an embodiment, the substrate 110 includes a surface region 112 and is held in a process stage within a process chamber (not shown). In another embodiment, the substrate 110 is an optically transparent solid material. For example, substrate 110 can use material such as glass, quartz, fused silica, or plastic, or metal, or foil, or semiconductor, or composite materials. Depending upon the embodiment, the substrate can be a single material, multiple materials, which are layered, composites, or stacked, including combinations of these, and the like. Of course there can be other variations, modifications, and alternatives.

Figure 2:
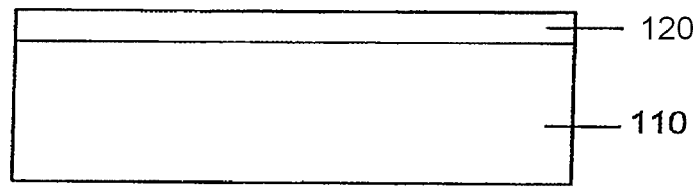

As shown in FIG. 2, the present method forms an electrode layer 120 overlying a surface region 112 of substrate 110. The electrode layer can be a suitable metal material, a semiconductor material or a transparent conducting oxide material, or a combination. Electrode layer 120 can be formed using techniques such as sputtering, evaporation (e.g., using electron beam), electro-plating, or a combination of these, and the like, according to a specific embodiment. Preferably, the electrode layer is characterized by a resistivity of about 10 Ohm/cm$^2$ to 100 Ohm/cm$^2$ and less according to a specific embodiment. In a specific embodiment, the electrode layer can be made of molybdenum or tungsten. The electrode layer can have a thickness ranging from about 100 nm to 2 micron in a specific embodiment, but can also be others depending on the application. Other suitable materials such as copper, chromium, aluminum, nickel, or platinum, and the like may also be used. Of course, there can be other variations, modifications, and alternatives.

Figure 3:
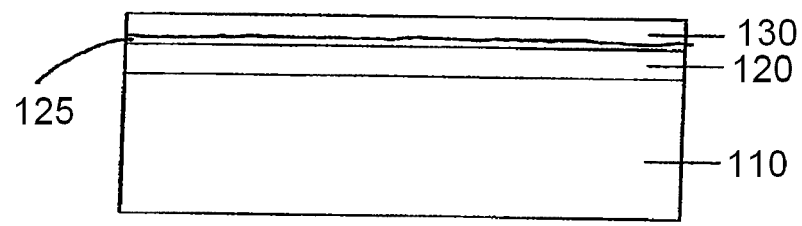

As shown in FIG. 3, a copper layer 130 is formed overlying the electrode layer. In particular, copper (Cu) layer 130 is formed overlying the electrode layer 120. For example, the copper layer can be formed using a sputtering process using a suitable copper target. In one example, a DC magnetron sputtering process can be used to deposit Cu layer 130 onto the electrode layer 120. The sputtering process is performed under a suitable pressure and temperature. In a specific embodiment, the sputtering process can be performed under a deposition pressure of about 6.2 mTorr. In a specific embodiment, the deposition pressure may be controlled using Ar gas. In a specific embodiment, an Ar gas flow rate of about 32 sccm is used to achieve the desired deposition pressure. Deposition can be provided at room temperature without heating the substrate. Of course, minor heating may result due to plasma generated during deposition. Additionally, a DC power supply of about 115 W may be used for the sputtering process. Depending on the embodiment, DC power ranging from 100 W to 150 W may be used depending on the specific materials used. A deposition time for a Cu layer of 330 nm thickness is about 6 minutes or more under the described deposition condition. Of course, the deposition condition can be varied and modified according to a specific embodiment.

In a preferred embodiment, the method includes forming a barrier layer 125 overlying the electrode layer to form an interface region between the electrode layer and the copper layer. In a specific embodiment, the interface region is maintained substantially free from a metal disulfide layer having a semiconductor characteristic that is different from a copper indium disulfide material formed during later processing steps. Depending upon the embodiment, the barrier layer has suitable conductive characteristics and can be reflective to allow electromagnetic radiation to reflect back into a photovoltaic cell or can also be transparent or the like. In a specific embodiment, the barrier layer is selected from platinum, titanium, chromium, or silver. Of course, there can be other variations, modifications, and alternatives.

Figure 4:
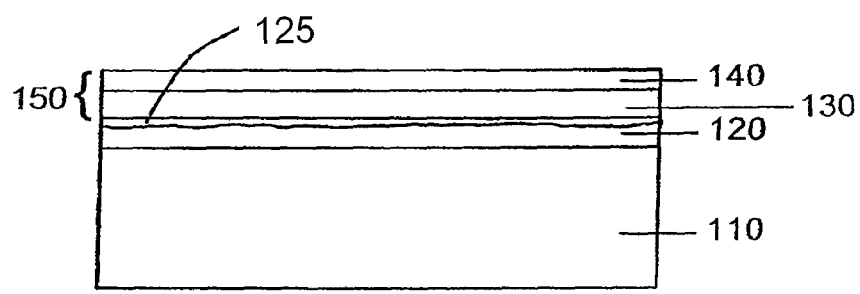

Referring now to FIG. 4. The method forms an indium layer 140 overlying copper layer 130. The indium layer is deposited over the copper layer using a sputtering process in a specific embodiment. In a specific embodiment, the indium layer can be deposited using a DC magnetron sputtering process under a similar condition for depositing the Cu layer. The deposition time for the indium layer may be shorter than that for Cu layer. As merely an example, 2 minutes and 45 seconds may be enough for depositing an In layer of about 410 nm in thickness according to a specific embodiment. In another example, the indium layer can be deposited overlying the copper layer using an electro-plating process, or others dependent on specific embodiment.

FIGS. 1 through 4 illustrate a method of forming a multilayered structure 150 comprising copper and indium on a substrate for a thin film photovoltaic device according to an embodiment of the present invention. In a specific embodiment, copper layer 130 and indium layer 140 are provided in a certain stoichiometry to allow for a Cu-rich material with an atomic ratio of Cu:In greater than 1 for the multilayered structure 150. For example, the atomic ratio Cu:In can be in a range from about 1.2:1 to about 2.0:1 or larger depending upon the specific embodiment. In an implementation, the atomic ratio of Cu:In is between 1.35:1 and 1.60:1. In another implementation, the atomic ratio of Cu:In is selected to be about 1.55:1. In a preferred embodiment, the atomic ratio Cu:In is provided such that Cu is limiting, which consumes essentially all of the indium species, in the resulting structure. In a specific embodiment, indium layer 140 is provided to cause substantially no change in the copper layer 130 formed until further processing. In another embodiment, indium layer 140 can be first deposited overlying the electrode layer followed by deposition of the copper layer 130 overlying the indium layer. Of course there can be other variations, modifications, and alternatives.

Figure 5:
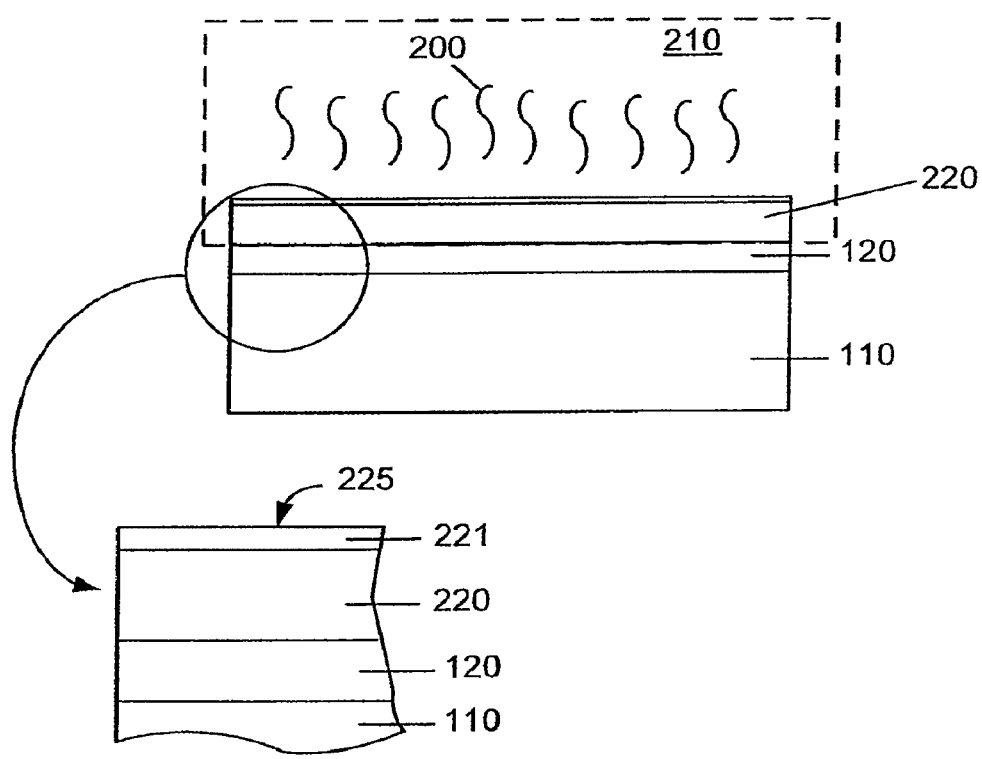

As shown in FIG. 5, multilayered structure 150 is subjected to a thermal treatment process 200. In a specific embodiment, the thermal treatment process is provided in an environment containing at least a sulfur bearing species 210. The thermal treatment process is performed at an adequate pressure and temperature. In a specific embodiment, the thermal treatment process is provided at a temperature ranging from about 400 Degrees Celsius to about 600 Degrees Celsius. In certain embodiment, the thermal treatment process can be a rapid thermal process provided at the temperature range for about three to fifteen minutes. In one example, the sulfur bearing species is in a fluid phase. As an example, the sulfur bearing species can be provided in a solution, which has dissolved $Na_2S$, $CS_2$, $(NH_4)_2S$, thiosulfate, among others. In another example, the sulfur bearing species 210 is gas phase hydrogen sulfide. In other embodiments, the sulfur bearing species can be provided in a solid phase. As merely an example, elemental sulfur can be heated and allowed to vaporize into a gas phase, e.g., as $S_n$. In a specific embodiment, the gas phase sulfur is allowed to react to the indium/copper layers. In other embodiments, combinations of sulfur species can be used. Of course, the thermal treatment process 200 includes certain predetermined ramp-up and ramp down time and ramp-up and ramp-down rate. For example, the thermal treatment process is a rapid thermal annealing process. In a specific embodiment, the hydrogen sulfide gas is provided through one or more entry valves with flow rate controls into the process chamber. The hydrogen sulfide gas pressure in the chamber may be controlled by one or more pumping systems or others, depending on the embodiment. Of course, there can be other variations, modifications, and alternatives.

In a specific embodiment, the sulfur bearing species can be provided as a layer material overlying the indium and copper layers or copper and indium layers. In a specific embodiment, the sulfur bearing species is provided as a thin layer or as a patterned layer. Depending upon the embodiment, the sulfur bearing species can be provided as a slurry, a powder, a solid material, a gas, a paste, or other suitable form. Of course, there can be other variations, modifications, and alternatives.

Referring to the FIG. 5, the thermal treatment process 200 causes a reaction between copper indium material within the multilayered structure 150 and the sulfur bearing species 210, thereby forming a layer of copper indium disulfide material (or a copper indium disulfide thin film) 220. In one example, the copper indium disulfide material or copper indium disulfide thin film 220 is formed by incorporating sulfur ions/atoms stripped or decomposed from the sulfur bearing species into the multilayered structure 150 with indium atoms and copper atoms mutually diffused therein. In an embodiment, the thermal treatment process 200 results in a formation of a cap layer 221 overlying the transformed copper indium disulfide material 220. The cap layer contains a thickness of substantially copper sulfide material but substantially free of indium atoms. The cap layer includes a surface region 225. In a specific embodiment, the formation of this cap layer is under a Cu-rich conditions for the Cu—In bearing multilayered structure 150. Depending on the embodiment, the thickness of the copper sulfide material 221 is on an order of about five to ten nanometers and greater based on original multilayered structure 150 with indium layer 140 overlying copper layer 130. Of course, there can be other variations, modifications, and alternatives.

Figure 6:
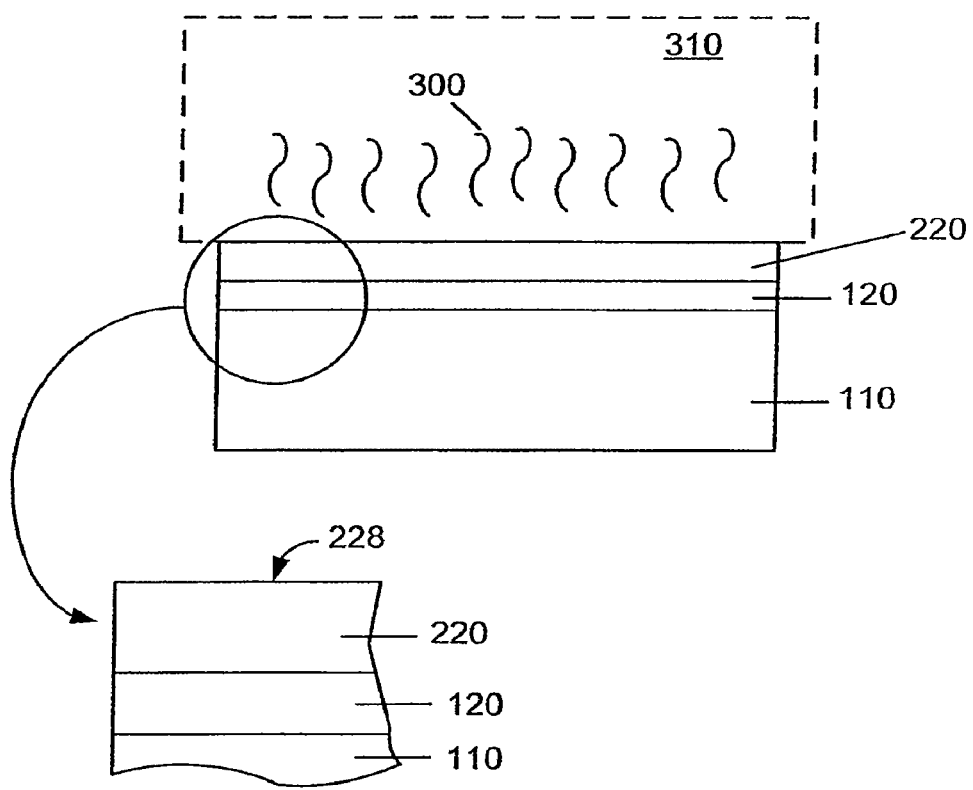

FIG. 6 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 6, a dip process 300 is performed to the copper sulfide material 221 that covers the copper indium disulfide thin film 220. In particular, the dip process is performed by exposing the surface region 225 to a solution of potassium cyanide 310 in a specific embodiment. In a specific embodiment, the solution of potassium cyanide has a concentration of about 1 weight % to about 10 weight % according to a specific embodiment. The solution of potassium cyanide acts as an etchant that is capable of selectively removing copper sulfide material 221 from the surface region of the copper indium disulfide material. The etching process starts from the exposed surface region 225 and down to the thickness of the copper sulfide material 221 and substantially stopped at the interface between the copper sulfide material 221 and copper indium disulfide material 220. As a result the copper sulfide cap layer 221 is selectively removed by the etching process to expose surface region 228 of the copper indium disulfide thin film material according to a specific embodiment. In a preferred embodiment, the etch selectivity is about 1:100 or more between copper sulfide and copper indium disulfide material. In other embodiments, other selective etching species can be used. In a specific embodiment, the etching species can be hydrogen peroxide. In certain embodiments, techniques including electro-chemical etching, plasma etching, sputter-etching, or any combination of these may be used. In a specific embodiment, the copper sulfide material can be mechanically removed, chemically removed, electrically removed, or any combination of these, and others. In a specific embodiment, an absorber layer made of copper indium disulfide can have a thickness of about 1 to 10 microns, but can be others. Of course, there can be other variations, modifications, and alternatives.

Figure 7:
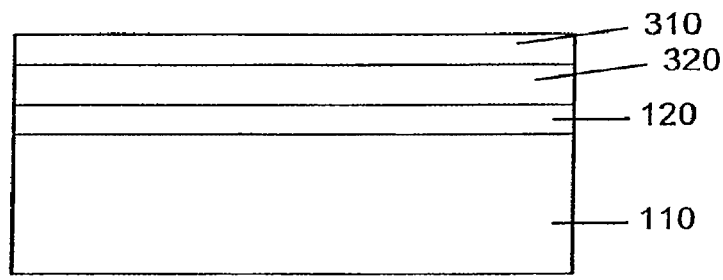
Figure 8:
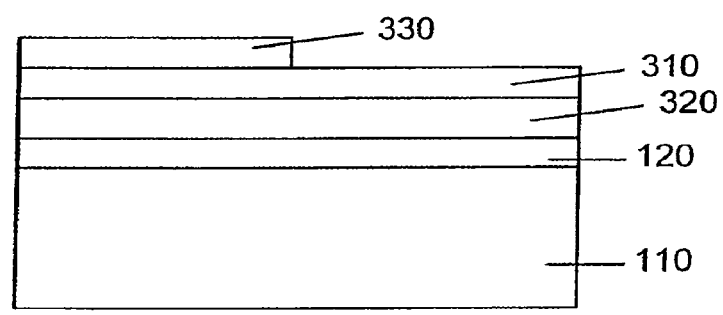

As shown in FIG. 7, the method further process the copper indium disulfide material to form a p-type copper indium disulfide film 320 in a specific embodiment. In certain embodiments, the as-formed copper indium disulfide material may have a desirable p-type semiconducting characteristic. In a specific embodiment, copper indium disulfide material 220 is subjected to a doping process to adjust p-type impurity concentration therein for the purpose of optimizing I-V characteristic of the high efficiency thin film photovoltaic devices. In an example, aluminum species are allowed to mix into the copper indium disulfide material 220. In another example, the copper indium disulfide material 220 is mixed with a copper indium aluminum disulfide material. Of course, there can be other variations, modifications, and alternatives.

Subsequently, a window layer 310 is formed overlying the p-type copper indium disulfide material 320. The window layer can be selected from a group consisting of a cadmium sulfide (CdS), a zinc sulfide (ZnS), zinc selenium (ZnSe), zinc oxide (ZnO), zinc magnesium oxide (ZnMgO), or others. In certain embodiments, these materials may be doped with one or more suitable impurities to form an $n^+$ type semiconductor material. The window layer and the absorber layer forms a PN-junction associated with a photovoltaic cell. The window layer, is heavily doped to form a $n^+$-type semiconductor layer in a preferred embodiment. In one example, indium species are used as the doping material to cause formation of the $n^+$-type characteristic associated with the window layer 310. In another example, the doping process is performed under suitable conditions. In a specific embodiment, the window layer can use an aluminum doped ZnO material. The aluminum doped ZnO material can range from about 200 nm to about 500 nanometers in a specific embodiment. Of course, there can be other variations, modifications, and alternative Referring to FIG. 8, the method forms a conductive layer 330 overlying a portion of a first surface region of the window layer 310. The conductive layer forms a top electrode layer for the photovoltaic device. In one embodiment, the conductive layer 330 is a transparent conductive oxide (TCO). For example, the TCO can be selected from a group consisting of $In_2O_3$:Sn (ITO), ZnO:Al (AZO), $SnO_2$:F (TFO), and the like, but can be others. In another embodiment, the TCO layer is provided in a certain predetermined pattern to maximize the fill factor and conversion efficiency of the photovoltaic device. In a specific embodiment, the TCO can also function as a window layer, which essentially eliminates a separate window layer. Of course there can be other variations, modifications, and alternatives.

In a preferred embodiment, the present method maintains an interface region between the electrode layer and the copper indium disulfide material substantially free from a metal disulfide layer having different semiconductor characteristics from the copper indium disulfide material. Depending upon the type of electrode material, the metal disulfide layer is selected from molybdenum disulfide layer or the like. In a specific embodiment, the interface region is characterized by a surface morphology substantially capable of preventing any formation of the metal disulfide layer, which is characterized by a thickness of about 5 nanometers to about 10 nanometers. In a preferred embodiment, the present method includes a thermal process during at least the maintaining process or a portion of the maintaining process of at least 300 Degrees Celsius and greater to prevent any formation of the metal disulfide layer, which can be a molybdenum disulfide or like layer. Of course, there can be other variations, modifications, and alternatives.

In a specific embodiment, the present invention provides a method for forming a thin film photovoltaic device, which is outlined below.

1. Start;
2. Provide a transparent substrate comprising a surface region;

3. Form a first electrode layer overlying the surface region;

4. Form a copper layer overlying the first electrode layer;

5. Form an indium layer overlying the copper layer to form a multi-layered structure (alternatively indium is formed first or a multiple layers are sandwiched together);

6. Subject at least the multi-layered structure to a thermal treatment process in an environment containing a sulfur bearing species;

7. Form a copper indium disulfide material from at least the treatment process of the multi-layered structure, the copper indium disulfide material comprising a copper-to-indium atomic ratio ranging from about 1.2:1 to about 2:1 or 1.35:1 to about 1.60:1 and a thickness of substantially copper sulfide material having a copper sulfide surface region;

8. Remove the thickness of the copper sulfide material to expose a surface region having a copper poor surface comprising a copper to indium atomic ratio of less than about 0.95:1 or 0.99:1;

9. Subject the copper poor surface to a copper species to convert the copper poor surface from an n-type characteristic to a p-type characteristic;

10. Subject the copper poor surface to a treatment process during a time period associated with the subjecting of the copper poor surface with the copper species; and 11. Form a window layer overlying the copper indium disulfide material;

12. Perform second electrode layer overlying window layer; and

13. Perform other steps, as desired.

The above sequence of steps provides a method according to an embodiment of the present invention. In a specific embodiment, the present invention provides a method and resulting photovoltaic structure free from parasitic junction regions in the absorber layer, which impair performance of the resulting device. Other alternatives can also be provided where steps are added, one or more steps are removed, or one or more steps are provided in a different sequence without departing from the scope of the claims herein. Details of the present method and structure can be found throughout the present specification and more particularly below.

FIGS. 9-11 are simplified diagrams illustrating a method and structure for forming a thin film photovoltaic device including copper species treatment according to an embodiment of the present invention. These diagrams are merely examples, which should not unduly limit the scope of the claims herein. One of ordinary skill in the art would recognize other variations, modifications, and alternatives. In a specific embodiment, the present method begins with partially completed photovoltaic device 900. As shown, the device includes a transparent substrate 901 comprising a surface region, although other substrates can be used. The device also includes a first electrode layer 903 overlying the surface region. In a specific embodiment, the first electrode layer can be any conductive material including conductive metals, oxides, and semiconductor or combinations of these, as well as any material described herein and outside of the present specification.

In a specific embodiment, the photovoltaic device includes a chalcopyrite material 905, which acts as an absorber for the photovoltaic device. As shown, the chalcopyrite material can include, among others, copper indium disulfide material, copper indium aluminum disulfide, copper indium gallium disulfide, combinations of these, and others. In a specific embodiment, the chalcopyrite has a thin layer of copper sulfide ($Cu_xS$) 907, which has been previously described, as may remain as a residue or fixed material. Of course, there can be other variations, modifications, and alternatives.

Referring to FIG. 10, the method selectively removes the thin layer of copper sulfide. In a specific embodiment, the thin layer of copper sulfide is removed 909 using a solution of potassium cyanide (KCN) or other suitable technique, e.g., dry etching, plasma etching, or sputtering. In a specific embodiment, the method may cause formation of a copper poor surface region 1001. In a specific embodiment, the copper poor surface is characterized by a copper to indium atomic ratio of less than about 0.95:1 or 0.99:1. In a specific embodiment, the copper poor surface region is characterized as an n-type material, which forms a parasitic junction with the p-type copper indium disulfide material, which can be rich in copper. The parasitic junction leads to poor or inefficient device performance. Of course, there can be other variations, modifications, and alternatives.

In a preferred embodiment, the present method subjects the copper poor surface to an ionic species to convert the copper poor surface from an n-type characteristic to a p-type characteristic 1101, which behaves like a normal copper indium disulfide surface, as shown in FIG. 11. In a preferred embodiment, the ionic species is copper ion, which can be derived from copper salts such as cuprous ($Cu^+$) salts or cupric ($Cu^{2+}$) salts or combinations, and others. Examples of the copper salt may include CuCl, $CuCl_2$, $Cu_2SO_4$, $CuSO_4$, $Cu(OAc)_2$, Cu(OAc) and others. In a specific embodiment, the subjecting the copper poor surface includes a thermal treatment process during a time period associated with the subjecting of the copper poor surface with the ionic species. In a specific embodiment, the thermal treatment process can be performed in a temperature range of about 100 Degrees Celsius to about 500 Degrees Celsius, but can be others. Additionally, the thermal treatment process occurs for a time period ranging from a few minutes to about ten minutes to an hour or so. Of course, there can be other variations, modifications, and alternatives.

In a specific embodiment, the copper species can be applied using one or more techniques. These techniques include deposition, sputtering, spin coating, spraying, spray pyrolysis, dipping, electro deposition, painting, ink jet coating, sprinkling, any combination of these, and others. In some embodiments, the copper species can be diffused from an overlying material, which can be an electrode layer or molybdenum or other suitable material. Alternatively, the copper species can be diffused from a piece of copper material or the like via a vapor phase. In a specific embodiment, the copper species can be diffused in vapor phase, but can be others, for short periods of time. In a specific embodiment, the ionic species treatment process passivates the surface at the heterojunction or the like, which facilitates carrier separation and transport. Additionally, the present ionic species treatment process can also generate desired conduction band offset, commonly called CBO. Of course, there can be other variations, modifications, and alternatives.

In a specific embodiment, the method includes forming a window layer overlying the copper indium disulfide material. The method also forms an electrode layer overlying the window layer. Depending upon the embodiment, the photovoltaic cell can be coupled to a glass or transparent plate or other suitable member. Alternatively, the photovoltaic cell can be coupled to another cell, e.g., a bottom cell, to form a tandem or multi junction cell. Again, there can be other variations, modifications, and alternatives.

Although the above has been illustrated according to specific embodiments, there can be other modifications, alternatives, and variations. Additionally, although the above has been described in terms of copper indium disulfide, other like materials such as copper indium gallium disulfide, copper indium aluminum disulfide, combinations thereof, and others can be used. Other materials may include $CuGaS_2$, $CuInSe_2$, $Cu(InGa)Se_2$, $Cu(InAl)Se_2$, $Cu(In,Ga)SSe$, combinations of these, and the like. In a specific embodiment, other cations can also be used. In a specific embodiment, the counterpart anion in the salt, in the broadest terms, are chalcogens (e.g., oxides, sulfides, selenides, tellurides), halogens (e.g., fluorides, chlorides, bromides, iodides), organic and inorganic molecular anions (e.g., acetates, carboxylates, cyanides, oxalates, benzoates, azides, anions derived from amides, organic chelates (e.g., EDTA), inorganic chelates, phosphates, sulfates, arsenates, etc.), and possibly Group V anions (e.g., nitrides, phosphides, arsenides, antimonides), but can be others. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a thin film photovoltaic device, the method comprising:

providing a transparent substrate comprising a surface region;

forming a first electrode layer overlying the surface region;

forming a copper layer overlying the first electrode layer;

forming an indium layer overlying the copper layer to form a multi-layered structure;

subjecting at least the multi-layered structure to a thermal treatment process in an environment containing a sulfur bearing species;

forming a copper indium disulfide material from at least the thermal treatment process of the multi-layered structure, the copper indium disulfide material comprising a copper-to-indium atomic ratio ranging from about 1.2:1 to about 2:1 and a thickness of substantially copper sulfide material having a copper sulfide surface region;

removing the thickness of the copper sulfide material to expose a surface region having a copper poor surface comprising a copper to indium atomic ratio of less than about 0.95:1;

subjecting the copper poor surface to a copper species to convert the copper poor surface from an n-type semiconductor characteristic to a p-type semiconductor characteristic;

subjecting the copper poor surface to a treatment process during a time period associated with the subjecting of the copper poor surface with the copper species; and forming a window layer overlying the copper indium disulfide material.

2. The method of claim 1 wherein the subjecting of the copper species is provided by at least one process selected from spin coating, spraying, spray pyrolysis, pyrolysis, dipping, deposition, sputtering, or electrolysis.

3. The method of claim 1 wherein the copper species is derived from a copper ion such as a cupric ion or a cuprous ion, or a combination.

4. The method of claim 1 wherein the removing comprises using a solution of potassium cyanide to selectively remove the thickness of copper sulfide material.

5. The method of claim 1 wherein the window layer is selected from a group consisting of a cadmium sulfide, a zinc sulfide, zinc selenide, zinc oxide, or zinc magnesium oxide.

6. The method of claim 1 wherein the treatment process of the copper poor surface comprises a thermal process ranging from about 100 Degrees Celsius to about 500 Degrees Celsius.

7. The method of claim 1 wherein the forming of the copper layer is provided by a sputtering process or plating process.

8. The method of claim 1 wherein the copper species compensates for any missing copper in the copper poor surface.

9. The method of claim 1 wherein the forming of the indium layer is provided by a sputtering process.

10. The method of claim 1 wherein the forming of the indium layer is provided by a plating process.

11. The method of claim 1 wherein the copper indium disulfide has a p-type semiconductor characteristic.

12. The method of claim 1 wherein the window layer comprises an n+-type semiconductor characteristic.

13. The method of claim 1 further comprising introducing an indium species in the window layer to cause formation of an n+-type semiconductor characteristic.

14. The method of claim 1 wherein the formed copper indium disulfide is mixed with a copper indium aluminum disulfide or copper indium gallium disulfide.

15. The method of claim 1 wherein the sulfur bearing species comprise hydrogen sulfide in fluid phase.

16. A method for forming a thin film photovoltaic device, the method comprising:

providing a transparent substrate comprising a surface region;

forming a first electrode layer overlying the surface region;

forming a chalcopyrite material overlying the electrode layer, the chalcopyrite material comprising at least a copper poor copper indium disulfide material including a copper poor copper indium disulfide material surface, the copper poor copper indium disulfide surface having an atomic ratio of Cu:In of about 0.99 and less; and compensating the copper poor copper indium disulfide material using a copper species to change in characteristic from an n-type to a p-type;

forming a window layer overlying the chalcopyrite material; and forming a second electrode layer overlying the window layer.

* * * * *